United States Patent [19]
Harabin et al.

[11] Patent Number: 5,828,923
[45] Date of Patent: Oct. 27, 1998

[54] APPARATUS AND METHOD FOR PROCESSING WATER WASH PHOTOPOLYMER SOLUTION

[75] Inventors: Gregory K. Harabin; Tadashi Hayashi, both of Charlotte, N.C.; Kimiaki Hirayama, Ibaraki; Keiichi Okajima, Katano, both of Japan

[73] Assignee: Nippon Paint Co., Ltd., Osaka, Japan

[21] Appl. No.: 707,611

[22] Filed: Sep. 5, 1996

[51] Int. Cl.⁶ .................................................. G03D 3/02
[52] U.S. Cl. ................................... 396/626; 210/725
[58] Field of Search ........................... 396/626, 630; 270/182, 178, 207, 725, 724, 727, 787, 734, 737, 774, 803

[56] References Cited

U.S. PATENT DOCUMENTS

| | | |
|---|---|---|
| 3,835,045 | 9/1974 | Hussissian ............................... 210/725 |
| 3,959,129 | 5/1976 | White et al. ............................. 210/694 |
| 4,738,785 | 4/1988 | Langston et al. ....................... 210/738 |
| 4,816,164 | 3/1989 | Presley .................................... 210/710 |
| 4,961,859 | 10/1990 | Uehara et al. .......................... 210/725 |
| 5,269,941 | 12/1993 | Chave et al. ............................ 210/725 |
| 5,344,573 | 9/1994 | Hill et al. ................................ 210/768 |
| 5,505,863 | 4/1996 | Danon et al. ............................ 210/774 |

*Primary Examiner*—D. Rutledge
*Attorney, Agent, or Firm*—Wenderoth, Lind & Ponack, L.L.P.

[57] ABSTRACT

An apparatus and a method for processing water wash photopolymer solution includes a washout unit for washing a flexographic printing plate with water, a holding tank for holding an effluent from the washout unit, and a mixing cone for mixing an amount of the effluent supplied from the holding tank with a coagulant so as to coagulate a solid content of the effluent with the coagulant.

8 Claims, 11 Drawing Sheets

APPARATUS AND METHOD FOR PROCESSING WATER WASH PHOTOPOLYMER SOLUTION

BACKGROUND OF THE INVENTION

The present invention relates to apparatus and method for processing water wash photopolymer solution in manufacturing a printing plate made of photosensitive resin and in particular, a flexographic printing plate of water-development type, with water-dispersion type resin grains which have been eluted in developer (water) being effectively removed. More specifically, the present invention relates to apparatus and method which utilize mixing devices employing cone mixing for coagulation of water wash photopolymer solution, i. e. separation of water wash type of flexographic photopolymer from its solution, to provide an excellent effluent to pass through the filtration media.

As developer to be used in making a flexographic printing plate, chlorine-series solvent such as 1, 1, 1-trichloroethane is being replaced by aqueous solvent which is safe and inexpensive. Oil-based ink dominates over aqueous ink. However, the function of a compound composing the flexographic printing plate that such component be dissolved in water during development is a reciprocal event of water-proof ink. In order to solve this situation, it is likely that a compound of the conventional water-soluble type will be replaced by a compound of the water-dispersion type.

However, with a compound of the water-dispersion type, grains are formed in an eluate in development. As a result, defective phenomena that the grains adhere to a developing device and the printing plate occur during development. Thus, it is necessary to solve such defective phenomena by discharging resin grains from a developer-circulating system and taking measures of dissolving the resin grains in the eluate.

It is desirable to have an efficient means to handle the separation of water wash photopolymer from its solution to have effective filtration. This efficiency provides for environmentally acceptable effluent to be disposed of. The ability for a mixing cone to continuously process the solution during the plate making process provides for non-stop operation.

Conventionally, various other methods for separation have been employed, such as use of a mixing tank where a known quantity of solution is mixed and then left to set for a period of time and then released to a filtration bed. A problem with this method has been a residual build up of separated photopolymer in the tank which creates high maintenance. Another method involves a batching and filtration design, known as "membrane" filtration. A problem with this method is its inability to continuously separate and filter during a normal work day. Therefore, an operator is required to stop the process of making plates while the separation and filtration process is conducted.

SUMMARY OF THE INVENTION

Accordingly, an object of the present invention is to provide apparatus and method for processing water can continuously and stably process water wash photopolymer solution to separate water wash photopolymer from the solution and which have excellent separating abilities during use.

In accomplishing this and other objects, according to one aspect of the present invention there is provided an apparatus for processing water wash photopolymer solution, which comprises:

a washout unit for washing a flexographic printing plate with water;

a holding tank for holding an effluent from the washout unit; and a mixing cone for mixing an amount of the effluent supplied from the holding tank with a coagulant so as to coagulate a solid content of the effluent with the coagulant.

According to another aspect of the present invention, there is provided a method for processing water wash photopolymer solution, which comprises steps of:

washing a flexographic printing plate with water in a washout unit;

holding an effluent from the washout unit in a holding tank; and mixing an amount of the effluent supplied from the holding tank with a coagulant in a mixing cone so as to coagulate a solid content of the effluent with the coagulant.

BRIEF DESCRIPTION OF THE DRAWINGS

These and other aspects and features of the present invention will become clear from the following description taken in conjunction with preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

Figure 1:
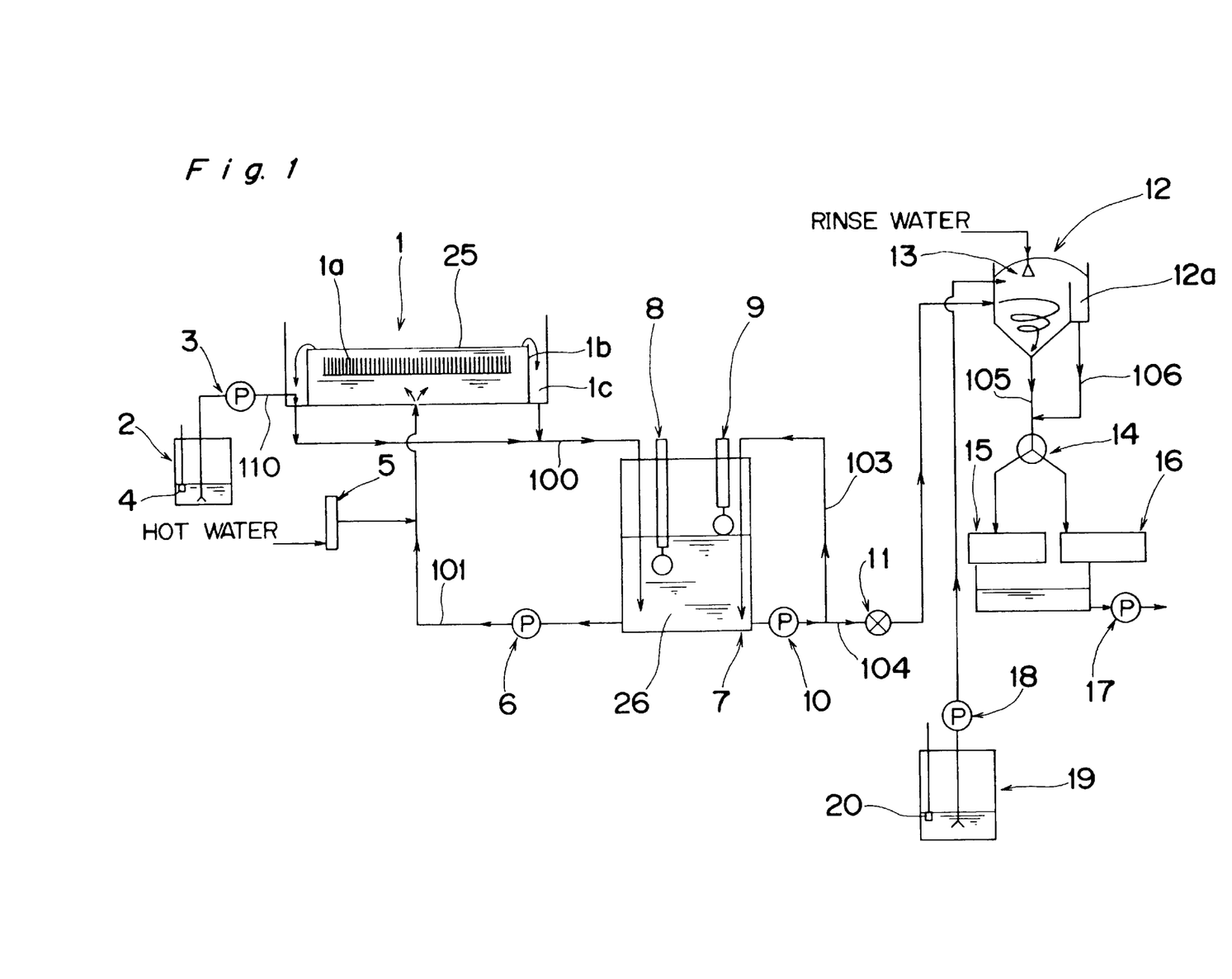
FIG. 1 is a schematic view of an apparatus for processing water wash photopolymer solution according to a first embodiment of the present invention.
Figure 2:
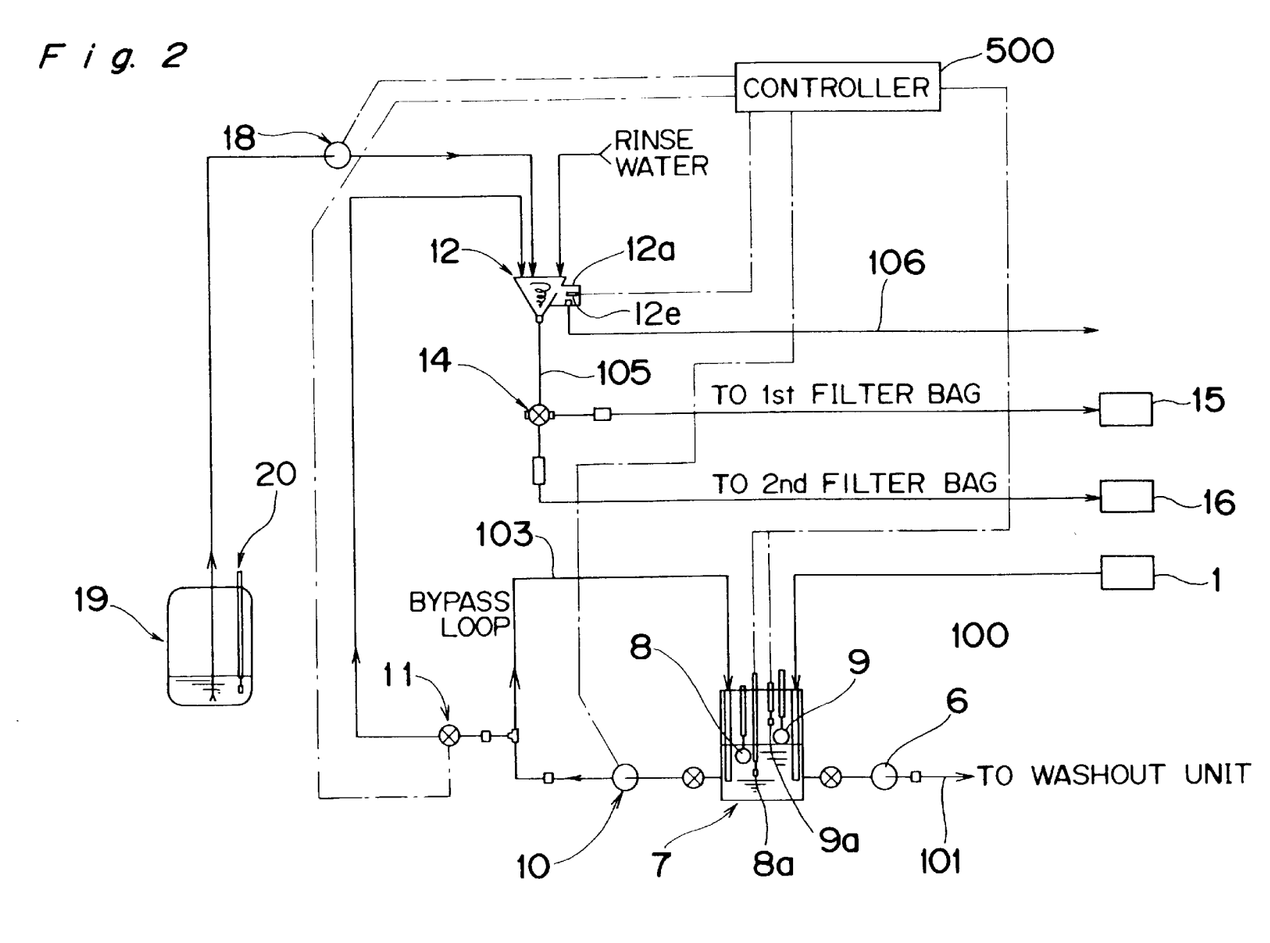
FIG. 2 is a schematic view explaining the connection between devices in the apparatus of FIG. 1.

A method and apparatus for processing water wash photopolymer solution, according to a first embodiment of the present invention, are described below with reference to FIGS. 1–10 and 13, 14. FIGS. 1 and 2 show schematic views of the apparatus and FIGS. 3–10, 13, and 14 show views of a specific form of the apparatus.

As shown in FIGS. 1 and 2, the apparatus to carry out the method generally includes a washout unit 1, a surfactant tank 2, a surfactant supply pump 3, a recycling pump 6, an effluent holding tank 7, an eluent supply pump 10, a mixing cone 12, a first filter bag 15, bag 16, a coagulant supply pump 18, and 19.

A flexographic printing plate (not shown) is washed for development in the washout unit 1 with hot water 25 at 40° C., for example. That is, an elution resin (unexposed portion), i.e. water wash photopolymer, is eluted from the flexographic printing plate supported inside the washout unit 1 and dispersed in the water 25 by a brush 1a. A resultant effluent overflows a weir 1b of the washout unit 1 into an overflow part 1c thereof so as to effectively supply the effluent to the holding tank 7. A surfactant for dispersing and emulsifying elution resin is held in the surfactant tank 2, and when it is detected by a level sensor 4 that the amount of the surfactant is higher than a specified value, the surfactant supply pump 3 is driven to supply the surfactant from the surfactant tank 2 to the overflow part 1c of the washout unit 1 via a path 110. While the resin which has eluted in the hot water 25 is being dispersed in the hot water 25 at the overflow part 1c of the washout unit 1, the resin is apt to be emulsified with the surfactant in the overflow part 1c and a path 100 so as to improve the quality of an image on the flexographic printing plate and reduce contaminants. The amount of the surfactant supplied to the overflow part 1c is experimentally determined. As the water which is used as the developer, purified city water is preferable. Preferably, ion exchange resin is used for natural water such as ground water which is high in hardness and hence unsuitable for plate-making, or the natural water is distilled to make it soft.

The holding tank 7 temporarily holds the effluent 26 from the washout unit 1 with the effluent 26 being heated to a specified temperature. The recycling pump 6 recycles the effluent between the holding tank 7 and the washout unit 1 via a circulating path 101. A certain amount of new hot water at 40° C., for example, is supplied to the circulating path 101 via a flow meter 5 so that the effluent from the holding tank 7 is supplied to the bottom of the washout unit 1 together with the new hot water so as to keep constant the temperature of the water in the washout unit 1, to stir the hot water 25 in the washout unit 1, and to achieve overflow of the water 25. The supply of the hot water to the washout unit 1 prevents clogs from being attached to the washout unit 1 and enables the temperature and concentration of resin to be uniform. As described above, since the hot water is supplied to the washout unit 1 and the surfactant is supplied to the effluent at the overflow part 1c, the concentration of the elution resin can be controlled and the durability of the apparatus can be increased. The effluent discharged from the washout unit 1 can be continuously processed at the mixing cone 12 and the filter bags 15 and 16 through the holding tank 7.

The holding tank 7 accommodates a stop transfer level sensor 8 and a start transfer level sensor 9 both of which detect the level of the effluent 26 held in the holding tank 7 and send signals to a controller 500 from detection switches 8a and 9a of the stop transfer level sensor 8 and the start transfer level sensor 9. The start transfer level sensor 9 detects that the level of the effluent 26 held in the holding tank 7 reaches an upper limit which indicates that the holding tank 7 holds a sufficient amount of the effluent 26. Thus, the eluent supply pump 10 is started to continuously feed a fixed amount of the effluent in the holding tank 7 to the mixing cone 12 and the coagulant supply pump 18 is started to continuously feed a corresponding amount of the coagulant in the coagulant tank 19 to the mixing cone 12. The stop transfer level sensor 8 detects that the level of the effluent 26 held in the holding tank 7 reaches a lower limit which indicates, that the holding tank 7 holds an insufficient amount of the effluent 26. Thus, the eluent supply pump 10 is stopped to interrupt feed of the effluent to the mixing cone 12 and the coagulant supply pump 18 is stopped to interrupt feed of the coagulant to the mixing cone 12. Therefore, only when the level of the effluent 26 in the holding tank 7 is between the upper and lower limits (distance H in FIG. 10), the fixed amount of the effluent is fed from the holding tank 7 to the mixing cone 12 by the effluent supply pump 10. The operation of the effluent supply pump 10 is controlled by the controller 500 based on the detected signals from the stop transfer level sensor 8 and the start transfer level sensor 9.

A flow control valve 11 for controlling an amount of flow of the effluent is arranged in a path 104 connected between the effluent supply pump 10 and the mixing cone 12 to ensure feed of the fixed amount of the effluent from the holding tank 7 to the mixing cone 12. That is, when the amount of flow of the effluent feeding from the holding tank 7 to the mixing cone 12 is larger than the fixed value, an excessive amount of the effluent is restricted by the flow control valve 11 and returned to the holding tank 7 via a bypass 103. Thus, the fixed amount of the effluent is fed from the holding tank 7 to the mixing cone 12 by the effluent supply pump 10 and the flow control valve 11 so that coagulation at the mixing cone 12 is stably performed.

Figure 3:
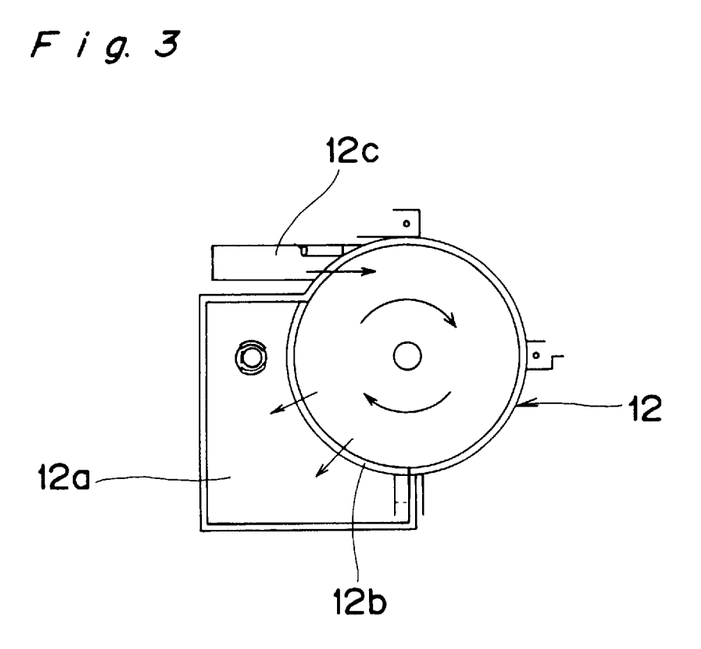
FIG. 3 is a plan view of a mixing cone in the apparatus.
Figure 4:
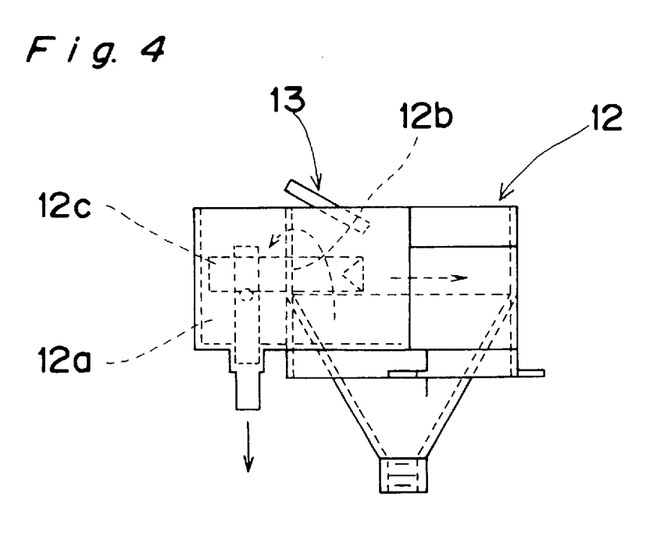
FIG. 4 is a side view of the mixing cone.

The effluent supply pump 10 and the coagulant supply pump 18 are concurrently driven so that the fixed amount of the effluent is supplied from the holding tank 7 to the mixing cone 12 at the same time that the coagulant is supplied from the coagulant tank 19 by the coagulant supply pump 18 and the effluent and the coagulant are mixed with each other to coagulate a solid content, i.e. the water wash photopolymer of the effluent, with the coagulant. The coagulant tank 19 and the coagulant supply pump 18 constitute a coagulant supply unit. The driving of the coagulant supply pump 18 is controlled by the controller 500 based on a signal outputted from a level sensor 20 in the coagulant tank 19 and indicating the level of the coagulant therein and the amount of flow of the effluent supplied from the holding tank 7 by the effluent supply pump 10. Then, the coagulant supply unit supplies to the mixing cone 12 the fixed amount of the coagulant which corresponds to the amount of the effluent supplied from the holding tank 7 to the mixing cone 12. That is, the amount of the coagulant to be supplied to the mixing cone 12 is determined by the amount of the effluent supplied to the mixing cone 12. The coagulant fed from the coagulant tank 19 to the mixing cone 12 by the coagulant supply pump 18 coagulates the water wash photopolymer of the effluent and thus, the water wash photopolymer thereof can be separated from a liquid content of the effluent at the filter bags 15 and 16 connected to the mixing cone 12. As shown in FIGS. 3 and 4, the effluent is supplied through an inlet 12c into a cone-shaped portion at a lower part of the mixing cone 12 so as to generate a rotary water flow shown by arrows. Therefore, the water wash photopolymer in the effluent can be efficiently uniformly coagulated by accelerating the mixture of the coagulant which has dripped from a supply inlet on the upper side of the mixing cone 12. Because the rotary water flow generated in the mixing cone 12 causes a turbulent state in a pipe connected with a portion subsequent to the mixing cone 12 in a path 105, it is effective for preventing the inner wall of the pipe from being polluted (due to adherence of solid content) even over elapse of time. Slurry containing an appropriate amount of coagulant uniformly mixed with the effluent prevents to a great degree the solid content from clogging a later-described bag-shaped filter, thus improving filtering efficiency remarkably. The effluent overflown from a weir 12b enters an overflow part 12a and is fed to the path 105 via an overflow path 106. The amount of the effluent is detected by a sensor 12e in the overflow part 12a to send a detection signal to the controller 500. The sensor 12e detects whether or not the amount of the effluent fed to the mixing cone 12 is excessive, and when the sensor 12e detects the overflown effluent, the sensor 12e sends a signal to the controller 500 to stop the driving of the effluent supply pump 10 and/or adjust the flow control valve 11. When the mixing cone 12 is cleaned, rinse water is supplied as a shower from a shower member 13 over the mixing cone 12 so as to remove clogs.

As the coagulant, calcium chloride water solution is preferable for the reason that the diameters of particles of the coagulant are small and clogging at the pipe of the path between the mixing cone 12 and the filter bags 15 and 16 can be prevent. Additionally, a certain amount of the coagulant is added to the effluent independent of the concentration of the eluent to treat the effluent, and thus, it is unnecessary to control the amount of the coagulant. Alternatively, magnesium chloride water solution can be used as the coagulant.

Furthermore, inorganic and organic (polymer) flocculating agents conventionally used in treating waste water can be used as the coagulant to be used in the mixing cone 12. For example, as inorganic flocculating agents, aluminum salts (aluminum sulfate, sodium aluminate, polyvinyl aluminum (PAC)) and iron salts (iron sulfate (II), iron chloride (III), iron sulfate (III), chlorinated copparas) can be used. As organic high molecular flocculating agents, anion polymers (sodium alginate, CMC sodium salt, poly acrylic sodium, partially hydrolyzed salt of polyacrylamide, copolymer of maleic acid), cation polymers (water-soluble aniline resin, polythionic urea, polyethyleneimine, acrylic polymer having quaternary ammonium salt in side chain, polyvinyl pyridines), and nonionic polymers (polyacrylic amide, polyoxyethylene, caustic starch) can be used. Of the above substances, the high polymer flocculating agents (cation polymers or ampholytic ion polymers) that do not greatly affect the pH of the liquid to be treated and that are safe are preferable.

The effluent discharged from the mixing cone 12 is fed to either the first filter bag 15 or the second filter bag 16 by a ball valve, i.e. a directional control valve 14. That is, the directional control valve 14 switches the first and second filter bags 15 and 16 to filtrate the effluent therein so as to separate the solid content (the water wash photopolymer) from the liquid content of the effluent. For example, when signaled that the first filter bag 15 is full or when the first filter bag 15 is exchanged with a new one or repaired, the effluent is fed to the second filter bag 16 by the directional control valve 14. Filtrated liquid from the filter bag 15 or 16 is discharged by a drain pump 17.

Because the mixing cone 12 is a cone or hopper having a cone-shaped portion, the solid content is uniformly (proper grain size range) dispersed in the slurry and in addition, a short pass, namely the passage of the liquid on only the surface of the slurry, does not occur. As a result, the clogging of the filtering materials of the filter bags 15 and 16 is reduced and favorable filtering efficiency can be achieved. Further, since rotary flow and thus a turbulent state is generated, the solid content adheres to the wall surface of the mixing cone 12 and the pipes of the paths 105, 106 to a small extent, thus enabling operation of the apparatus for a long time and facilitating maintenance thereof.

Figure 5:
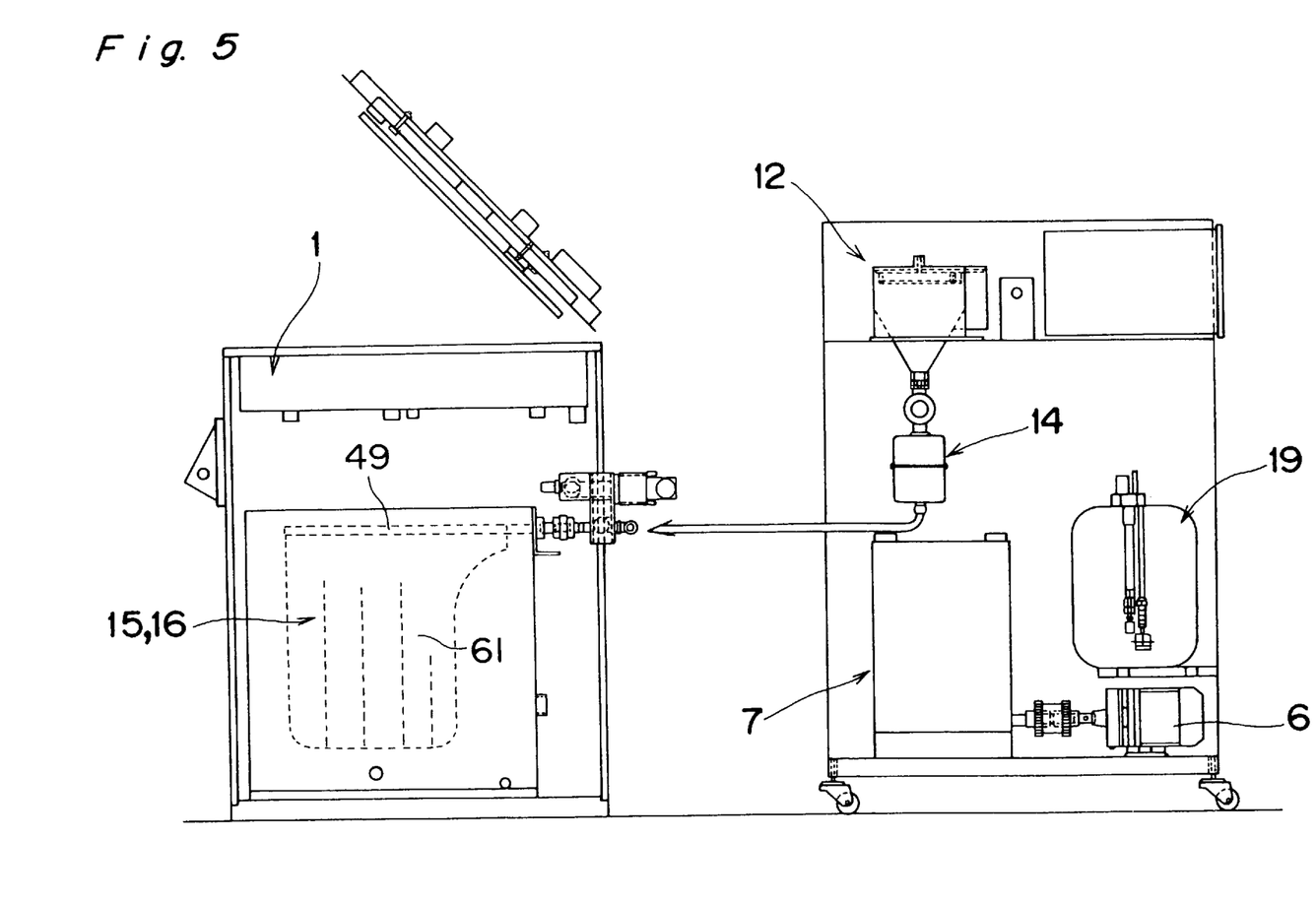
FIG. 5 is a side view of the apparatus.
Figure 6:
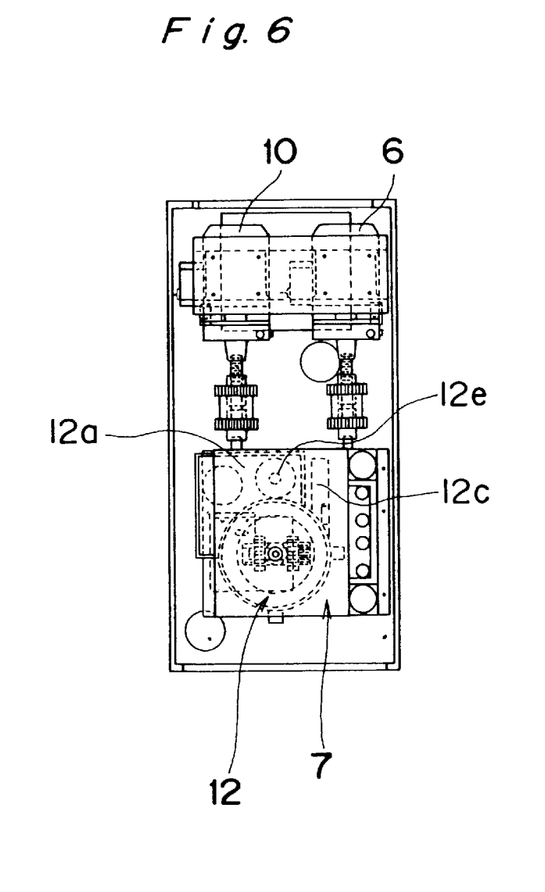
FIG. 6 is a plan view of a part of the apparatus.
Figure 7:
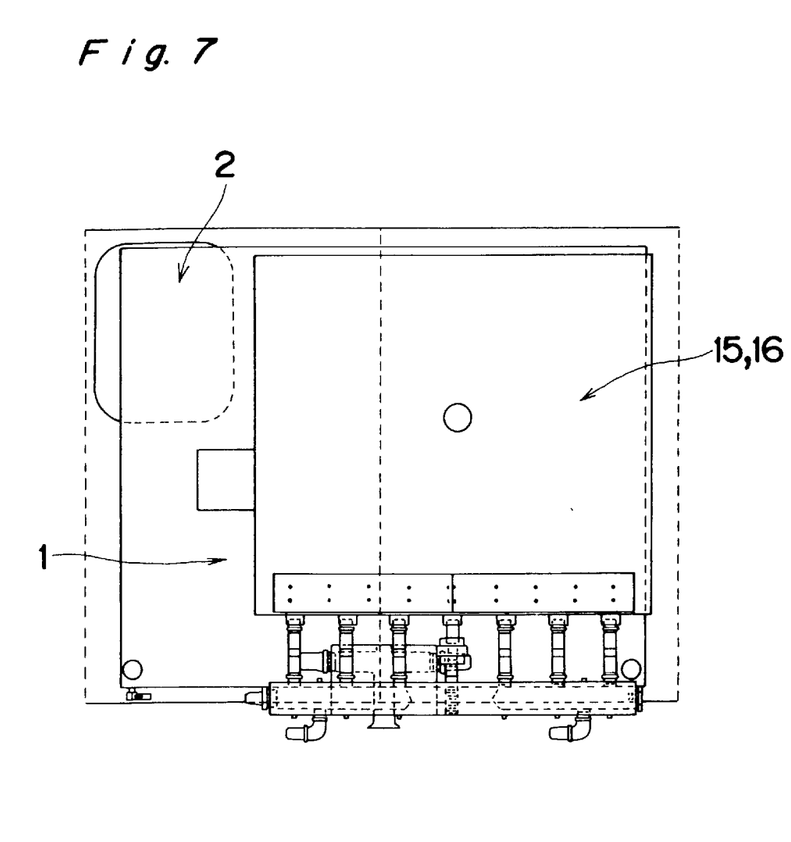
FIG. 7 is a plan view of another part of the apparatus.
Figure 8:
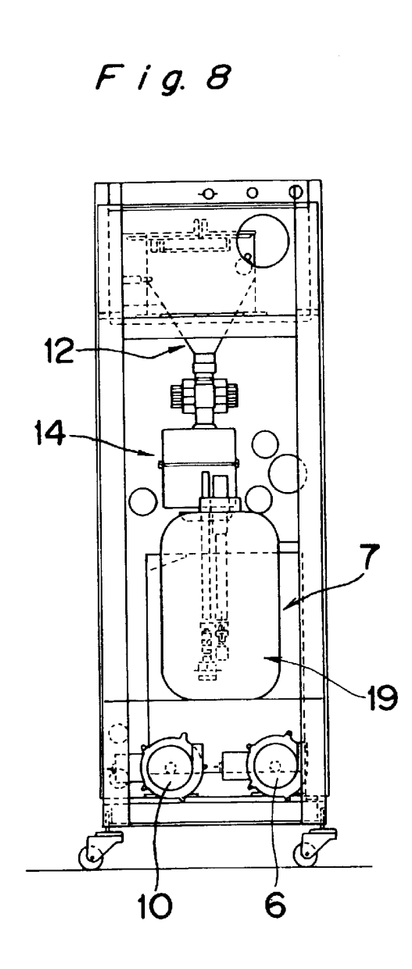
FIG. 8 is a rear view of a part of the apparatus.
Figure 9:
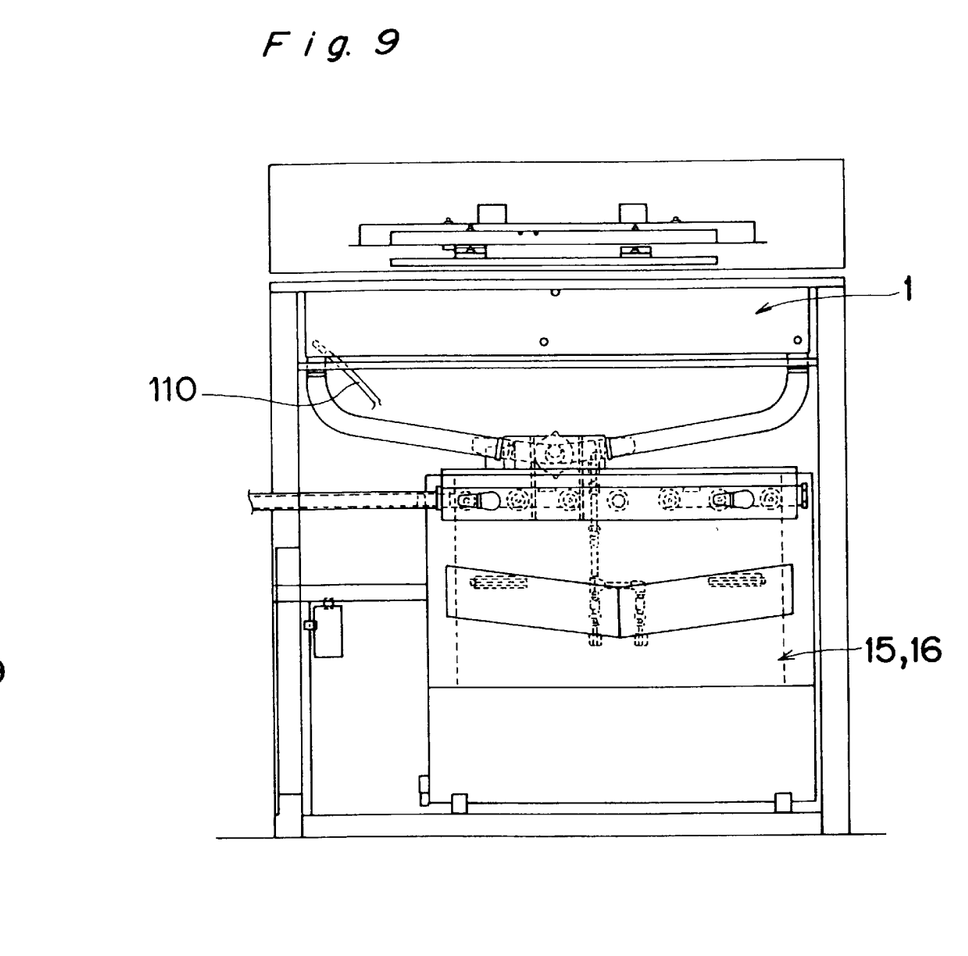
FIG. 9 is a rear view of another part of the apparatus.
Figure 10:
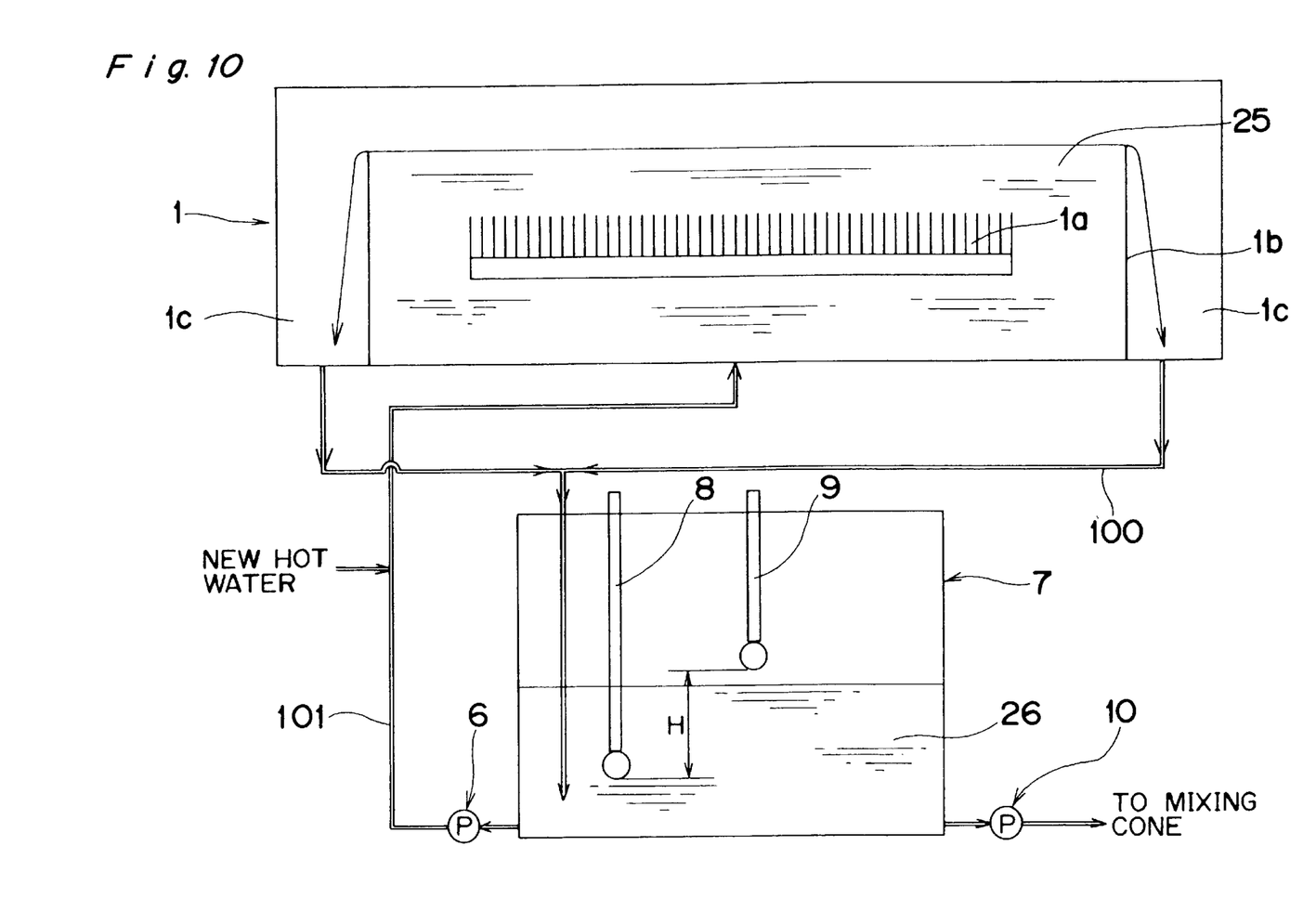
FIG. 10 is an enlarged view of a washout unit of the apparatus.
Figure 13:
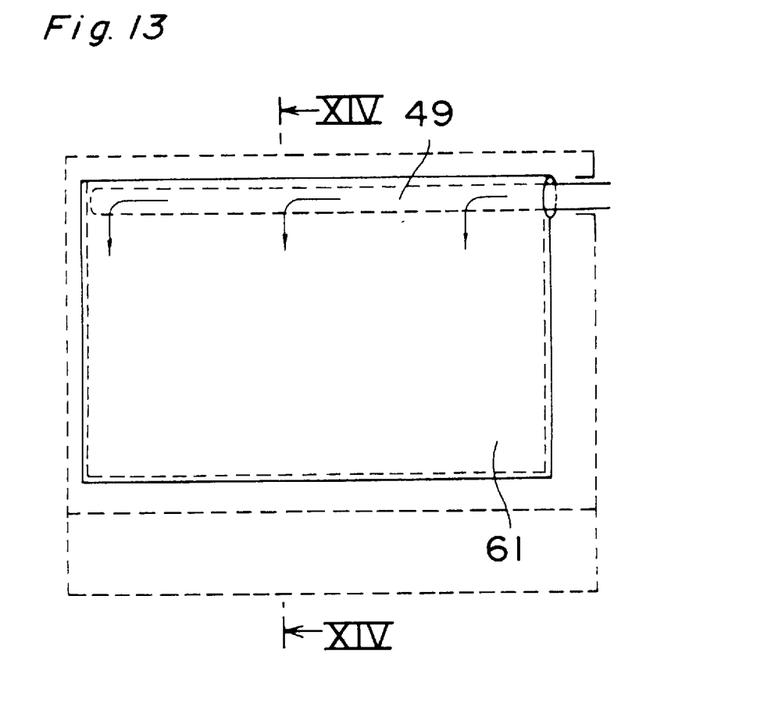
FIG. 13 is a front view showing a filter bag of the apparatus shown in FIG. 5.
Figure 14:
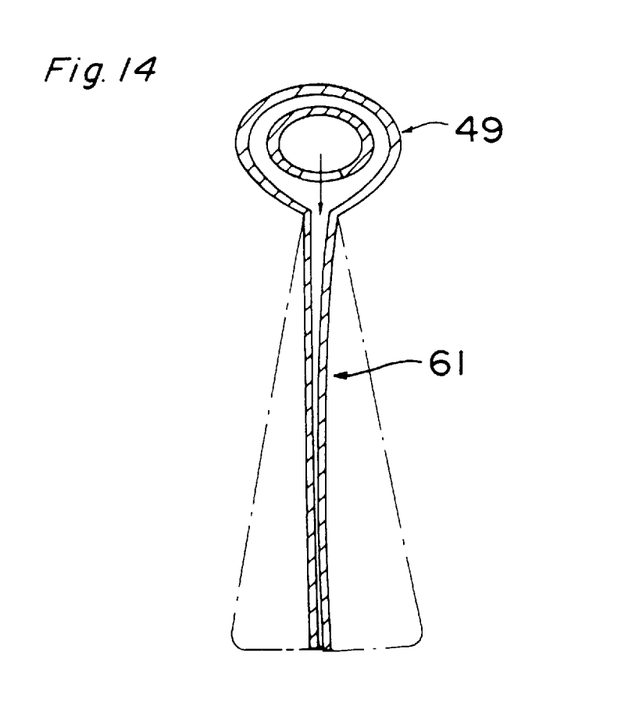
FIG. 14 is a sectional view, showing the filter bag of FIG. 13, taken along line XIV—XIV of FIG. 13.

One example of the filter bags 15 and 16 is shown in FIGS. 5, 13, and 14. A rectangular bag filter 61 formed by folding a piece of cloth double and sewing together three sides except the folded portion is prepared, and a slurry discharge pipe 49 is inserted into the bag-shaped folded portion of the filter 61. Preferably, the material of the filter 61 is cloth made of rayon, polyester, polypropylene, or nylon. Screen gauze (made of nylon, tetron, silk, or stainless) conventionally used in screen printing may be processed for use as material of the filter 61. Favorably, the average diameter of holes of the filter is 3 through 500 microns, and more favorably 20 through 200 microns, to prevent the filter from clogging, improve dehydration performance, and improve the efficiency of collecting the solid content. Desirably, the filtering area of the filter 61 is great. Depending on the kind of slurry and filter, as a criterion, favorably the supply amount (load) of slurry per area (1 cm$^2$) of filter is 0.05 through 10 milliliters/cm$^2$ per time (one minute), and more favorably 0.1 through 5 milliliters/cm$^2$, to prevent the filter from clogging and maintain filtering efficiency.

Figure 15:
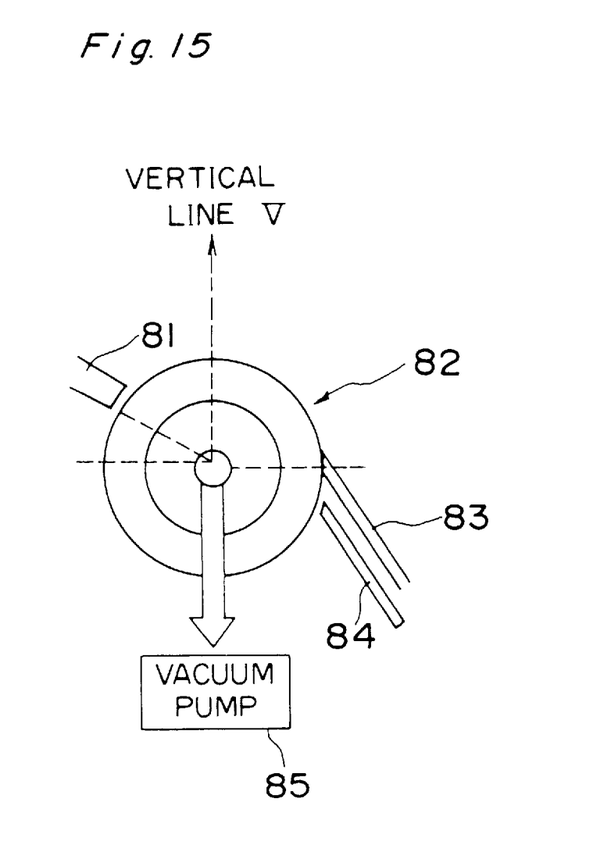
FIG. 15 is a schematic side view showing another filter of the apparatus.

Another example of the filter is shown in FIG. 15. Slurry containing the coagulated solid content and the liquid content of the effluent is supplied from the mixing cone 12 to a continuous type vacuum filtration unit 82, for example having a rotary cylindrical filtering material of an Oliver filter, via a conduit 81. During operation of the apparatus, the pressure inside the filtering material is kept at a pressure-reduced state, namely at degree vacuum of 400 through 600 mmHg, and the liquid content of the slurry supplied to the continuous type vacuum filtration unit 82 via the conduit 81 is absorbed into the filtering material to dehydrate the slurry so that the solid content is adhered to the surface of the filtering material. The rotational speed of the filtering material is arbitrarily adjusted according to the speed of formation of cake (dehydrated solid content). The filtering material is rotated around a center shaft by a rotary motor provided to drive only the filtering material. The solid content which has adhered to the surface of the filtering material is dehydrated by the suction force of a vacuum pump 85 via the filtering material. Thereafter, the solid content (cake-shaped) is discharged to the outside of the apparatus due to the scraping effect of a scraper 83 and a cake chute 84. The vacuum pump 85 is of the water-sealed type, and hence supplemental water is supplied thereto from a filtrate tank (not shown). Filtered liquid is collected into the filtrate tank disposed alongside the vacuum pump 85. The filtering material is composed of porous material (average of hole diameters: several microns through several tens of microns). The filtering material is wound around a porous drum, or molded into a cylindrical configuration if the filtering material is hard. Filtering material made of diatomaceous earth is best known. In addition, resin in the form of a sponge layer made of soft polyvinyl acetal (Examined Japanese Patent Publication No. 64-10247) and a porous material formed by mixing hard phenol resin and polyvinyl acetal resin with each other (Examined Japanese Patent Publication No. 3-66004), ceramic, and material made of carbon may be used. Any of these filtering materials can be advantageously utilized in the present invention.

According to the first embodiment, the mixing cone 12 is used in the process of separating the water wash flexographic photopolymer from its solution through filtration. Part of the effluent is recirculated between the holding tank 7 and the washout unit 1. During the washout process, a fixed amount of new hot water and surfactant are introduced as a batch solution into the water 25 in the washout unit 1. When the sensors 8 and 9 in the holding tank 7 detect a sufficient "high" level of the effluent 26 held in the holding tank 7 and send a signal to the controller 500, the effluent supply pump 10 and the coagulant supply pump 19 initiate a transfer of the effluent 26 to the mixing cone 12 along with a fixed amount of coagulant. The swirling action of the effluent and coagulant in the mixing cone 12 thoroughly mixes the effluent and coagulant creating separation. The geometry of the mixing cone 12 is important so as to have sufficient time to allow the coagulation to take place before reaching the exit of the mixing cone 12. This process of coagulation provides for the complete filtration of the water wash flexographic photopolymer prior to passing through the filter media of the filter bag 15 or 16. The separated fluid is then transferred by the drain pump 17 to a filtration unit where the solids are filtered from the fluid. The effluent is then acceptable to be discharged to a waste drain. The coagulated photopolymer can be disposed of as solid landfill waste.

Therefore, the separation of the water wash flexographic photopolymer from its solution can be stably and continuously performed.

Figure 11:
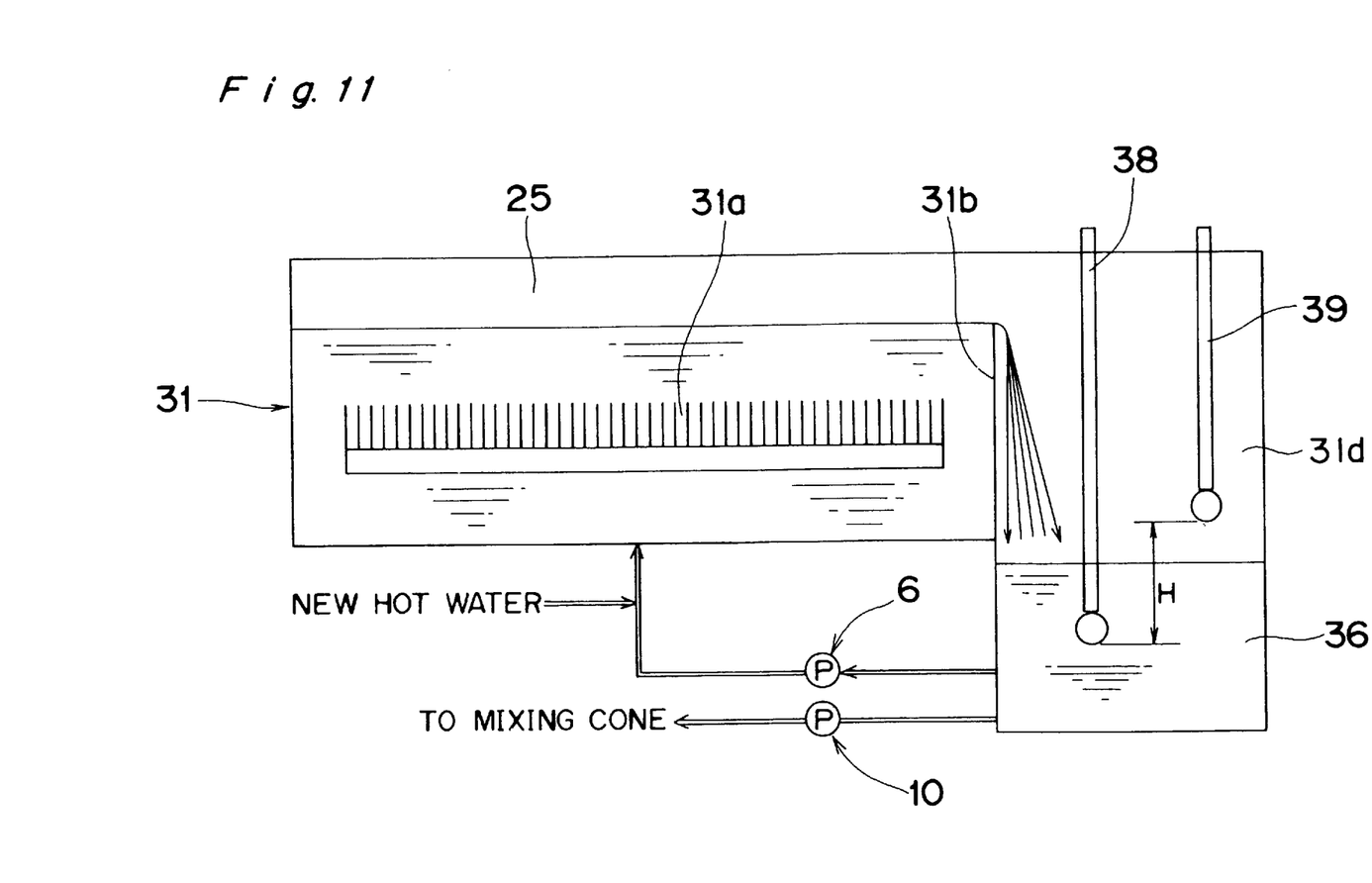
FIG. 11 is an enlarged view of a washout unit of an apparatus according to a second embodiment of the present invention.

An apparatus according to a second embodiment of the present invention is shown in FIG. 11 in which the holding tank is integrally connected to the washout unit. As shown in FIG. 11, a washout unit 31 corresponding to the washout unit 1 has at its side a holding tank part 31d corresponding to the holding tank 7. The holding tank part 31d has a stop transfer level sensor 38 and a start transfer level sensor 39 which respectively correspond to the stop transfer level sensor 8 and the start transfer level sensor 9. The elution resin (unexposed portion), i.e. water wash photopolymer, is eluted from the flexographic printing plate supported inside the washout unit 31 and dispersed in the water 25 by a brush 31a. An effluent is overflowed from a weir 31b to the holding tank part 31d of the washout unit 31. The effluent is supplied to the mixing cone 12 under the control of the controller 500 based on the level of the effluent 36 in the holding tank part 31d.

Figure 12:
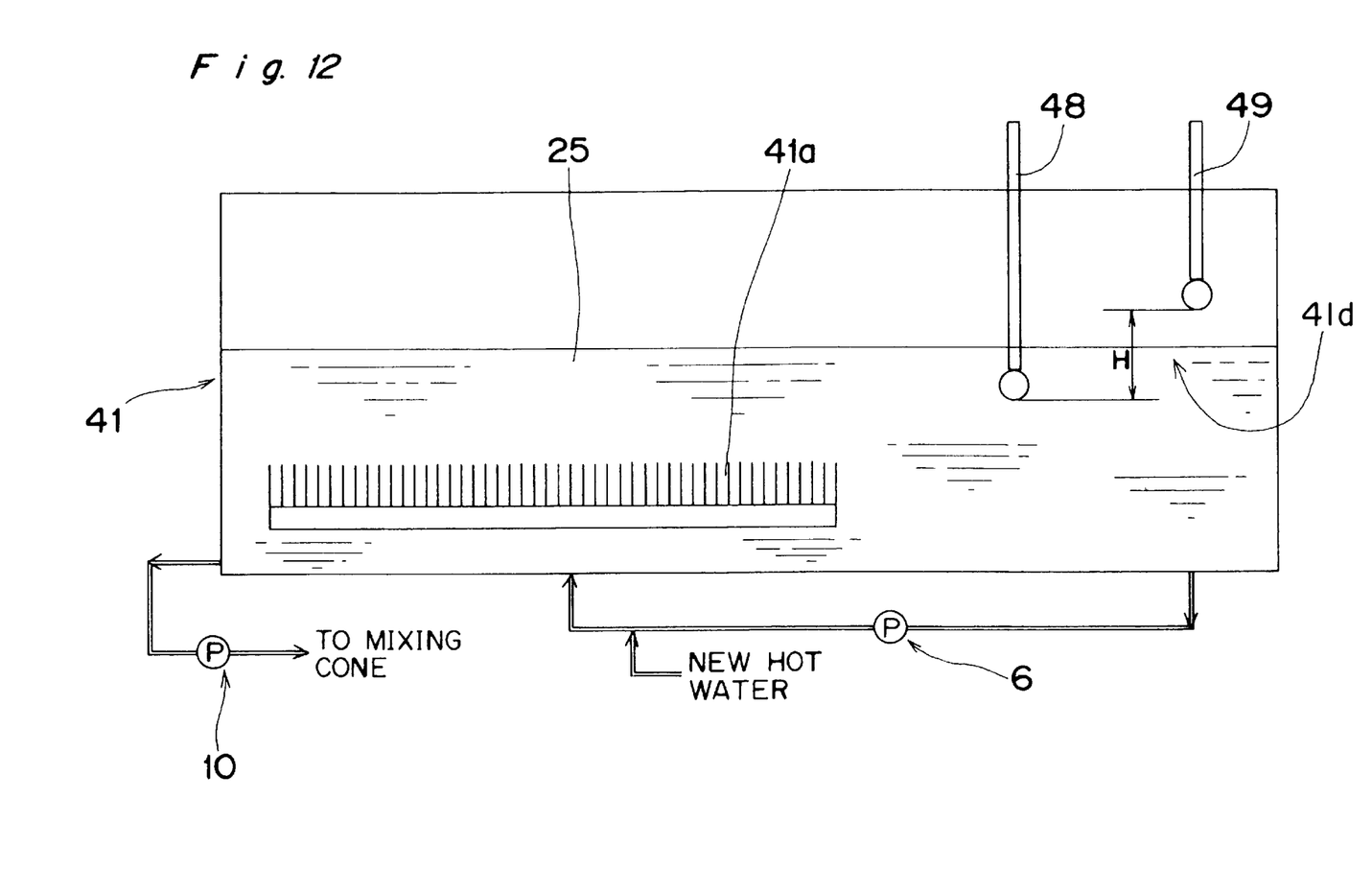
FIG. 12 is an enlarged view of a washout unit of an apparatus according to a third embodiment of the present invention.

An apparatus according to a third embodiment of the present invention is shown in FIG. 12 in which the holding tank is integrally formed in the washout unit. As shown in FIG. 12, a washout unit 41 corresponding to the washout unit 1 has, as a part thereof, a holding tank part 41d corresponding to the holding tank 7. The holding tank part 41d has a stop transfer level sensor 48 and a start transfer level sensor 49 which respectively correspond to the stop transfer level sensor 8 and the start transfer level sensor 9. The elution resin (unexposed portion), i.e. water wash photopolymer, is eluted from the flexographic printing plate supported inside the washout unit 41 and dispersed in the water 25 by a brush 41a. The water 25 which is also effluent in the holding tank part 41d is supplied to the mixing cone 12 under the control of the controller 500 based on the level of the water 25 in the holding tank part 41d.

Conventional flexographic printing plate-making apparatuses include a cylindrical type for allowing a printing plate to be installed on a cylinder so as to develop the printing plate, a one-way automatic processor for making plates automatically and continuously, and a one-way semi-automatic processor for making plates semi-automatically and continuously, in addition to the flat plate type shown in FIG. 1. The present invention can be applied to these apparatuses.

The recycling pump 6 can be omitted when it is unnecessary to recycle the effluent between the holding tank 7 and the washout unit 1.

Although the present invention has been fully described in connection with preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for processing water wash photopolymer solution, said apparatus comprising:

a washout unit for washing a flexographic printing plate with water and thereby forming a resultant effluent;

a surfactant supply to supply surfactant to said washout unit;

a hot water supply to supply hot water to said washout unit;

a holding tank for receiving the effluent flowing from said washout unit and for holding the effluent; and a mixing cone for receiving an amount of the effluent held in said holding tank from said holding tank and for mixing the amount of effluent with a coagulant, thereby to coagulate a solid content of the effluent with the coagulant.

2. An apparatus as claimed in claim 1, further comprising an effluent supply pump for supplying the amount of effluent from said holding tank to said mixing cone, and a coagulant supply pump for supplying to said mixing cone an amount of the coagulant in correspondence to the amount of effluent.

3. An apparatus as claimed in claim 2, further comprising a coagulant tank for holding the coagulant to be supplied to said mixing cone by said coagulant supply pump, and a controller for controlling said effluent supply pump and said coagulant supply pump so that said effluent supply pump and said coagulant supply pump are operated based on a level of the effluent held in said holding tank and a level of the coagulant held in said coagulant tank.

4. An apparatus as claimed in claim 1, wherein the coagulant is a calcium chloride water solution.

5. An apparatus as claimed in claim 1, wherein the effluent overflows a weir from said washout unit into an overflow part and then passes from said overflow part to said holding tank.

6. An apparatus as claimed in claim 1, wherein said holding tank is attached to a side of said washout unit and receives the effluent directly from said washout unit.

7. An apparatus as claimed in claim 6, wherein the effluent overflows a weir from said washout unit to said holding tank.

8. An apparatus as claimed in claim 1, wherein the holding tank is incorporated into said washout unit as a holding tank part thereof, so that the effluent after said washing is held in said holding tank part and then is supplied from said holding tank part to said mixing cone.

\* \* \* \* \*